United States Patent
Gauthier et al.

(10) Patent No.: US 6,441,640 B1
(45) Date of Patent: Aug. 27, 2002

(54) CMOS-MICROPROCESSOR CHIP AND PACKAGE ANTI-RESONANCE PASS-BAND SHUNT APPARATUS

(75) Inventors: Claude R. Gauthier, Fremont, CA (US); Brian Amick, Plano, TX (US); Tyler J. Thorp, Sunnyvale; Richard L. Wheeler, San Jose, both of CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/754,575

(22) Filed: Jan. 4, 2001

(51) Int. Cl.$^7$ .............................................. H03K 17/16
(52) U.S. Cl. .............................. 326/30; 326/27; 326/83
(58) Field of Search ............................. 326/21, 26, 27, 326/30, 83, 86

(56) References Cited

U.S. PATENT DOCUMENTS

| | | | | |
|---|---|---|---|---|
| 4,585,001 A | * | 4/1986 | Belt | 326/30 |
| 5,049,764 A | | 9/1991 | Meyer | 307/443 |
| 5,424,656 A | * | 6/1995 | Gibson et al. | 326/63 |
| 5,644,255 A | * | 7/1997 | Taylor | 326/30 |
| 5,781,028 A | * | 7/1998 | Decuir | 326/30 |
| 6,201,412 B1 | * | 3/2001 | Iwata et al. | 326/83 |

* cited by examiner

Primary Examiner—Don Phu Le
(74) Attorney, Agent, or Firm—Rosenthal & Osha L.L.P.

(57) ABSTRACT

A circuit for regulating resonance in a micro-chip has been developed. The circuit includes micro-chip supply voltage and a ground voltage, and a band-pass shunt regulator that is in parallel to the capacitor across the supply and ground voltages. The regulator will short circuit the supply and ground voltages at a pre-determined frequency to reduce the resonance effect on the micro-chip.

9 Claims, 2 Drawing Sheets

CMOS-MICROPROCESSOR CHIP AND PACKAGE ANTI-RESONANCE PASS-BAND SHUNT APPARATUS

BACKGROUND

As microprocessor circuits have achieved greater and greater speeds, these circuits have become more and more sensitive to the effects of parasitic inductance. The parasitic inductance can come from such sources as bond wires, IC package leads, and external supply lines that provide operating power. The problem with such characteristics is that they form a very high supply line impedance at the resonance frequency. This may lead to circuit oscillation 10 as shown in FIG. 1. In order to avoid such undesirable effects on circuit operation, the inductance must be suitably controlled.

Prior art methods of controlling parasitic inductance include connecting an external capacitor between the supply leads. This connection creates a passive bypass that decreases the supply line oscillation due to external inductances. However, it does not significantly reduce the oscillation caused by internal inductances. Another prior method includes connecting on on-chip capacitor between the internal supply leads. The capacitor acts as a bypass in the same manner as an external capacitor. The resulting non-oscillating circuit performance is shown in FIG. 2. However, in order to be effective, the internal capacitor must be very large. This has the drawback of occupying a significant portion of the chip area. Consequently, this method is generally undesirable when minimization of the die area is of great importance.

Another prior art approach involves increasing the amount of charge stored or delivered to a given amount of added on-chip de-coupling capacitance by actively increasing the voltage variation across their terminals. FIG. 3 shows a schematic of this technique with resistance losses. In this method, fully charged capacitors 32 and 34 of equal value are stacked in series 36 across the on-chip Vdd/Vss grid. The capacitors serve as a voltage multiplier for the Vdd/Vss grid. The depleted voltage in each capacitor is Vdd/n, where n is the number of capacitor stacks. Conversely, the stacked capacitors will store charge from the Vdd/Vss grid until the terminals across the capacitors are fully at Vdd.

A capacitance amplification factor (G) represents the charge supplied to the grid by the switched capacitors normalized to the charge furnished by regular decoupled capacitors given the same supply voltage variation. The amplification can be expressed as $G=(k+n-1)/(k*n^2)$, where n is the number of stacks and k is the voltage regulation tolerance. With each capacitor having a value (Cd), the equivalent unstacked capacitance of Cd*n is reduced to Cd/n upon stacking with a total stack voltage of Vdd*n.

FIG. 4a shows a schematic 40 of an implementation of the method. The circuit shows mutually exclusive CMOS switches the configure the capacitors (C1) 50 and (C2) 52 to either be in the charging phase (shunt across Vdd/Vss) or in the discharging phase (in series with Vdd/Vss). The circuit has two sections: the $V_{ave}$ (average voltage) tracking loop 42 and the $V_{inst}$ (instant voltage) monitor and charge pump loop 44. The switches are driven by two complementary driver 46 and 48. These drivers each provide 2 outputs with enough voltage offset to ensure minimal leakage through both charge and discharge switches during switching activity.

Instantaneous voltage supply variation ($V_{inst}$) is monitored by coupling the Vdd and Vss onto a comparator 48 input that is dynamically biased about a reference voltage ($V_{ave}$). $V_{ave}$ is a high-pass filtered version of the local ((Vdd−Vss)/2. Its low frequency cutoff clears the low end resonance range, but it also rejects the tracking of low-frequency disturbances that are not due to resonance. The coupled $V_{inst}$ feed the main negative feedback loop as charge is pumped in and out of the switched capacitors 50 and 52 coupled to the Vdd/Vss grid in an attempt to defeat the voltage variations. The compensated high frequency cutoff ensures stable loop response while also clearing the high end of the resonance range.

FIG. 4b shows the operation 54 of the circuit shown in FIG. 4a. Specifically, the graph shows: a steady state when $V_{inst}=V_{ave}$; a discharging phase when $V_{inst}<V_{ave}$; and a charging phase when $V_{inst}<V_{ave}$. The high frequency and low frequency cutoffs are also shown for their respective phases.

While the method of using stacked capacitors has been demonstrated to be effective in minimizing the effect of parasitic inductance, space is at a premium in microprocessor design. Any method of obtaining the same performance while reducing the required area on the chip yields significant cost benefits.

SUMMARY OF INVENTION

In some aspects the invention relates to an apparatus for regulating resonance in a micro-chip comprising: a micro-chip supply voltage line; a micro-chip ground voltage line; and a band-pass shunt regulator connected in parallel with the capacitor across the micro-chip supply voltage line and the micro-chip ground voltage, wherein the shunt regulator shorts the supply voltage and the ground voltage at a pre-determined frequency.

In an alternative embodiment, the invention relates to an apparatus for regulating resonance in a micro-chip comprising: a micro-chip supply voltage line; a micro-chip ground voltage line; and means for shorting the supply voltage and ground voltage at a pre-determined frequency.

In an alternative embodiment, the invention relates to a method for regulating resonance in a micro-chip comprising: connecting a band-pass shunt regulator across the micro-chip supply voltage and the micro-chip ground voltage; and short circuiting the micro-chip supply voltage and the micro-chip ground voltage with the band-pass shunt regulator at a pre-determined voltage.

The advantages of the invention include, at least, provide regulation a resonance in a micro-chip with a reduce area requirement that results in reduced die size and decreased cost.

BRIEF DESCRIPTION OF DRAWINGS

FIG. 4b a graph of the charging and discharging cycle of the circuit shown in FIG. 4a.

DETAILED DESCRIPTION

Figure 1:
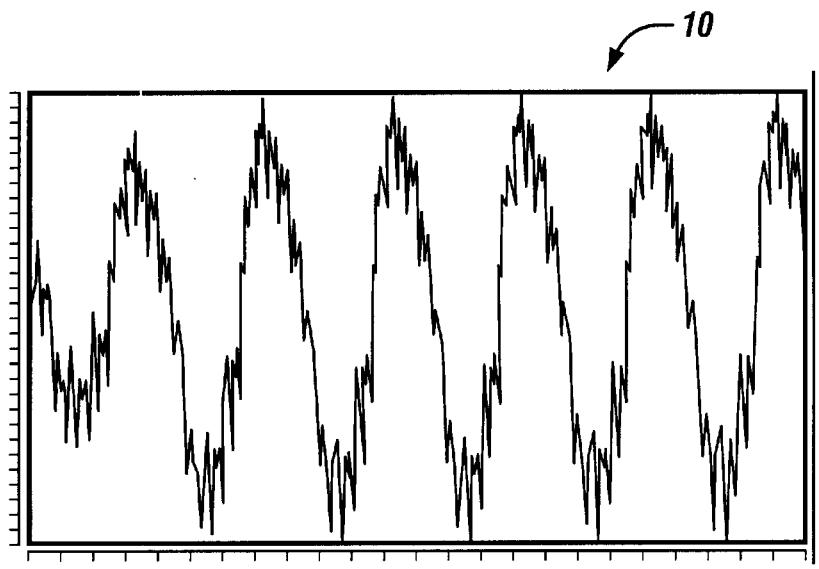
FIG. 1 shows a graph of an oscillating circuit.
Figure 2:
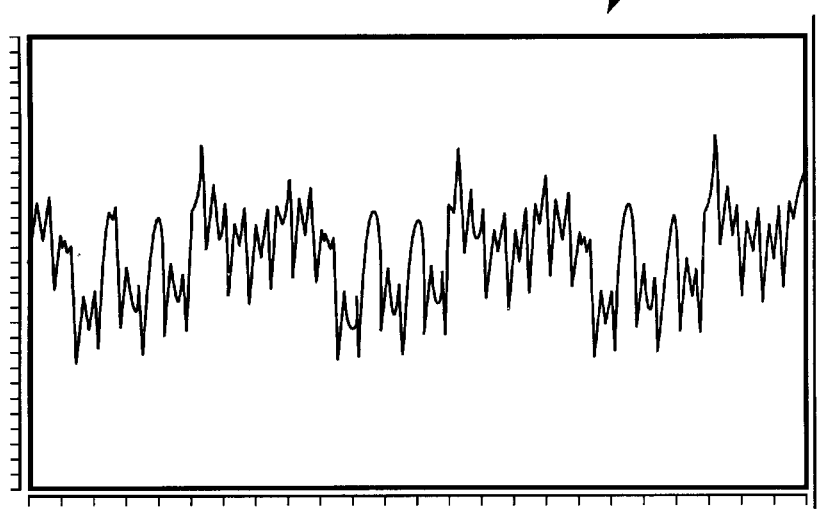
FIG. 2 shows a graph of a non-oscillating circuit.
Figure 3:
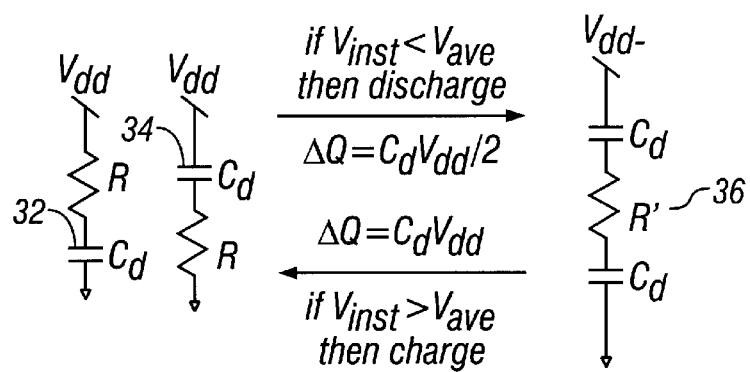
FIG. 3 shows a schematic of prior art stacked series capacitors.

Exemplary embodiments of the invention will be described with reference to the accompanying drawings. Like items in the drawings are shown with the same reference numbers.

Figure 4A:
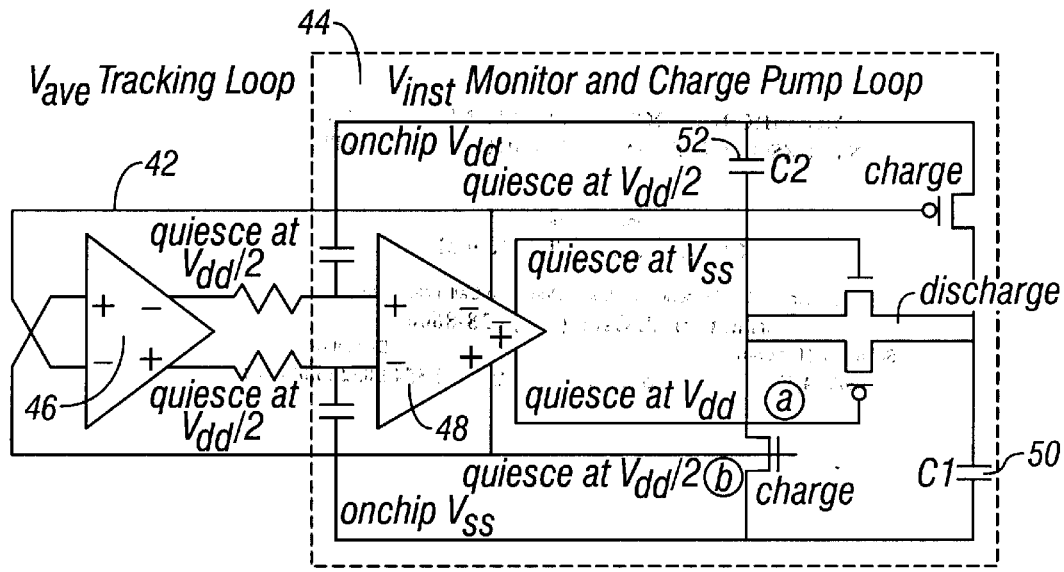
FIG. 4a shows a schematic of a prior art tracking loop and monitor charge pump loop.
Figure 4B:
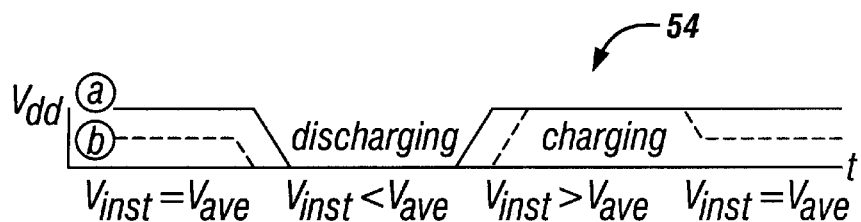
Figure 5:
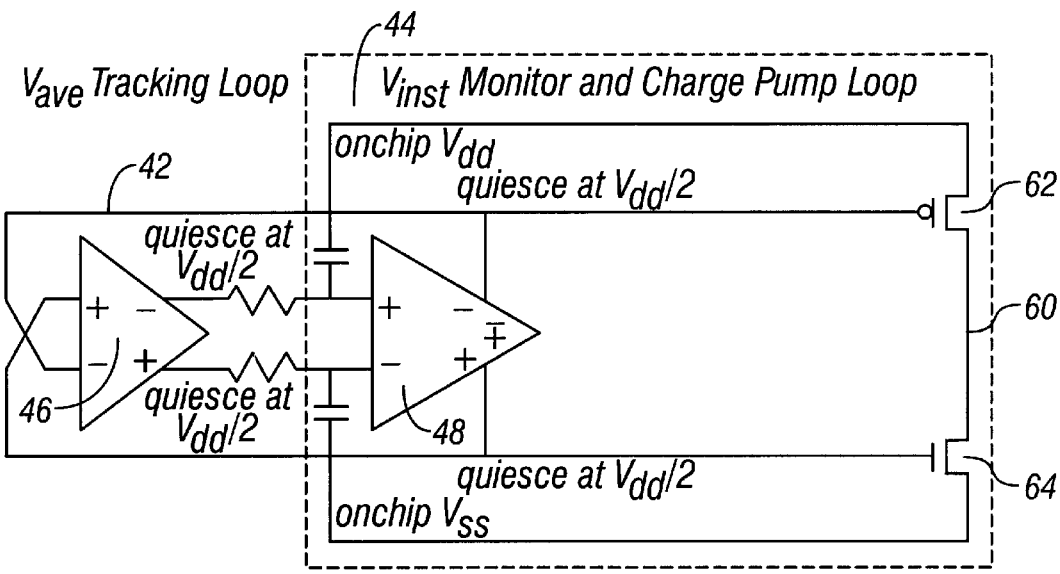
FIG. 5 shows a schematic of one embodiment of the present invention.

FIG. 5 shows a schematic of one embodiment of the present invention. The figure shows a circuit similar to that shown in FIG. 4a. However, the present invention has replaced the stack capacitors and switches with a band-passs-hunt regulator 60 in parallel to the circuit. The shunt regulator 60 includes two transistors: a PMOS or "p-type" transistor 62 and a NMOS or "n-type" transistor 64.

The transistors 62 and 64 are in series with each other. The entire shunt regulator 60 is tied across the Vdd and Vss power supply lines. The regulator 60 will short the supply voltage (Vdd) with the ground (Vss) at a certain resonance frequency. This frequency is determined by the characteristics of the components of the regulator. Once the regulator shorts the supply and ground voltages, it in effect acts as a damping resistor and consequently reduces the resonance effect on the circuit. While FIG. 5 shows only one regulator, it is possible to use multiple regulators according to the design criteria of the circuit.

The use of a band-pass shunt regulator will reduce the required chip area for the circuit by over 50% due to the lessened load on the other components. The net result is a reduction in die size and cost without a degradation in performance While the invention has been disclosed with reference to specific examples of embodiments, numerous variations and modifications are possible. Therefore, it is intended that the invention not be limited by the description in the specification, but rather the claims that follow.

What is claimed is:

1. An apparatus for regulating resonance in a micro-chip comprising:
    a micro-chip supply voltage line;
    a micro-chip ground voltage line; and
    a band-pass shunt regulator connected in parallel with a capacitance across the micro-chip supply voltage line and the micro-chip ground voltage, wherein the shunt regulator shorts the supply voltage and the ground voltage when a voltage in the micro-chip overshoots due to a resonance condition of the micro-chip.

2. The apparatus of claim 1, further comprising a plurality of band-pass shunt regulators connected across the micro-chip supply voltage and the micro-chip ground voltage.

3. The apparatus of claim 1, wherein the band-pass shunt regulator comprises two transistors in series, the transistors connected across the micro-chip supply voltage and the micro-chip ground voltage.

4. The apparatus of claim 3, wherein one of the transistors comprises a p-type transistor and one transistor comprises an n-type transistor.

5. An apparatus for regulating resonance in a micro-chip comprising:
    means for providing a supply-voltage;
    means for providing a ground voltage; and
    means for resistively shorting the supply voltage and the ground voltage when a voltage in the micro-chip overshoots due to a resonance condition of the micro-chip.

6. A method for regulating resonance in a micro-chip comprising:
    connecting a band-pass shunt regulator across a micro-chip supply voltage and a micro-chip ground voltage; and
    shorting the micro-chip supply voltage and the micro-chip ground voltage with the band-pass shunt regulator when a voltage in the micro-chip overshoots due to a resonance condition of the micro-chip, wherein the band-pass shunt regulator is a resistive shunt.

7. The apparatus of claim 6, further comprising connecting a plurality of band-pass shunt regulators across the micro-chip supply voltage and the micro-chip ground voltage.

8. The apparatus of claim 6, wherein the band-pass shunt regulator comprises two transistors in series, the transistors connected across the micro-chip supply voltage and the micro-chip ground voltage.

9. The apparatus of claim 8, wherein one of the transistors comprises a p-type transistor and one transistor comprises an n-type transistor.

* * * * *